United States Patent
Gudmondson (10) Patent No.: US 7,298,423 B1
(45) Date of Patent: Nov. 20, 2007

(54) TIME BASED DIGITAL FM DEMODULATOR

(75) Inventor: Daniel Gudmondson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 529 days.

(21) Appl. No.: 10/998,386

(22) Filed: Nov. 29, 2004

(51) Int. Cl.
*H04N 9/66* (2006.01)
*H03D 3/00* (2006.01)

(52) U.S. Cl. .................. 348/639; 348/727; 329/343
(58) Field of Classification Search ................ 348/638, 348/639, 726, 727; 329/341, 343; 455/214; 375/324, 328, 340
See application file for complete search history.

(56) References Cited

U.S. PATENT DOCUMENTS

| | | | | |
|---|---|---|---|---|
| 4,570,126 A | * | 2/1986 | Demmer et al. | ............ 329/327 |
| 4,963,381 A | * | 10/1990 | Girard et al. | ............... 426/490 |
| 5,117,441 A | * | 5/1992 | Weigand | ..................... 375/336 |
| 5,260,800 A | * | 11/1993 | Sturm et al. | .................... 386/2 |
| 5,548,343 A | * | 8/1996 | Paquier et al. | .............. 348/691 |
| 5,585,761 A | * | 12/1996 | Lamberg et al. | ............ 329/304 |
| 5,757,858 A | * | 5/1998 | Black et al. | ................. 375/295 |
| 6,922,555 B1 | * | 7/2005 | Mohindra | .................... 455/314 |
| 7,065,162 B1 | * | 6/2006 | Sorrells et al. | ............. 375/343 |

\* cited by examiner

*Primary Examiner*—Victor R. Kostak
(74) *Attorney, Agent, or Firm*—Wong, Cabello, Lutsch, Rutherford & Brucculeri, LLP (57) ABSTRACT

A time-based, digital FM demodulator circuit receives a stream of digital samples corresponding to an analog FM waveform. The samples are provided to a zero crossing detector, which allows a counter to determine a number of clock cycles between zero crossings. The resolution of this coarse period determination is further refined by an intercept calculation, which further localizes the zero crossing of the FM waveform based on interpolation between samples on either side of the zero crossing. Accuracy of the period determination may be further enhanced by use of a sinusoidal correction filter, which minimizes error caused by the linear interpolation performed on the sinusoidal waveform. Although the FM demodulator circuit is particularly suitable for demodulation of the chroma component of a SECAM video signal, it may advantageously be applied in a wide variety of FM demodulation applications.

22 Claims, 5 Drawing Sheets

Fig. 6

TIME BASED DIGITAL FM DEMODULATOR

BACKGROUND OF THE INVENTION

1. Field of the Invention:

The invention generally relates to video decoders and more specifically to composite video decoders and FM demodulators for use in decoding the color information of a SECAM (Sequential Couleur Avec Mémoire) composite video signal.

2. Description of Related Art

There is a large surge in the use of digital video devices today. Examples include: digital televisions, LCD (Liquid Crystal Display) TVs (televisions) and monitors, DVD (digital versatile disk) recorders, personal video recorders, PC (personal computer) video cards, video capture and streaming applications, and video conferencing. In many cases, these units need to receive an analog video signal, which may be one of the composite signals, such as NTSC (National Television Standards Committee), PAL (Phase Alternating Line) or SECAM; S-video; component video or RGB (Red-Green-Blue). It is then desirable to produce the proper digital output, such as eight or ten bit ITU-R (International Telecommunications Union-Radio Communication) BT (Broadcast Television) 656. It is preferred that all the video decoding be done in a single chip for all of these formats. The decoder not only has to handle composite signals, which means it must be able to determine the chroma and luma values, but it also must handle vertical blanking interval (VBI) data and handle VCRs (video cassette recorders), which frequently have unstable timing signals.

Although a number of such systems have been developed, it is always desirable to improve the output and capabilities of the particular video decoder. For example, it is desirable to support as many video formats as possible while maintaining a certain level of circuit simplicity, both for cost and reliability purposes. Unlike NTSC and PAL composite video, SECAM video includes color information that is frequency modulated. Thus to be able to decode SECAM video, a video decoder must include an FM demodulator. Historically, phase locked loops (PLLs) have been used for FM demodulation. However, these components are susceptible to various forms of electrical noise, and further add to the cost and complexity of the video decoder circuits.

Therefore a need exists in the art for a means of performing time-based FM demodulation to eliminate the need for the PLL. It would be further advantageous to perform the demodulation in the digital domain, so as to reduce the susceptibility of the circuitry to various forms of noise and error.

SUMMARY OF THE INVENTION

The present invention is directed to a time-based, digital FM demodulator circuit. The FM demodulator receives a stream of digital samples corresponding to an analog FM waveform. These samples are provided to a zero crossing detector, which allows a counter to determine a number of clock cycles between zero crossings. The resolution of this coarse period determination is further refined by an intercept calculation, which further localizes the zero crossing of the FM waveform based on interpolation between samples on either side of the zero crossing. Accuracy of the period determination may be further enhanced by use of a sinusoidal correction filter, which minimizes error caused by the linear interpolation performed on the sinusoidal waveform.

Although the FM demodulator circuit is particularly suitable for demodulation of the chroma component of a SECAM video signal, it may advantageously be applied in a wide variety of FM demodulation applications.

DETAILED DESCRIPTION OF THE PREFERRED EMBODIMENT

Figure 1:
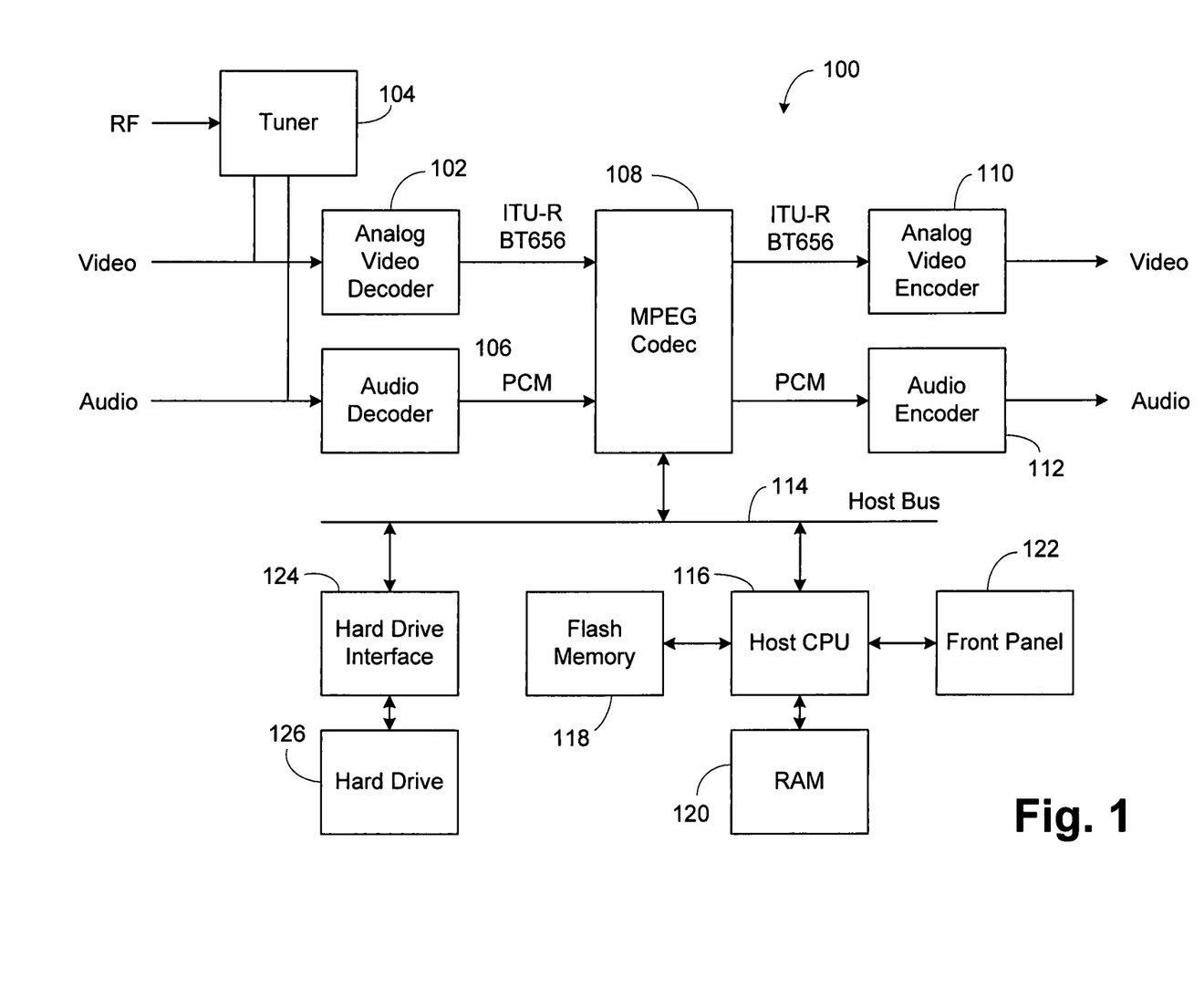
FIG. 1 displays a block diagram of an exemplary personal video recorder using an analog video decoder according to the present invention.

Referring now to FIG. 1, an exemplary personal video recorder (PVR) 100 is shown. PVR 100 is an exemplary use of analog video decoder 102, and it is understood that the analog video decoder can be used in multiple applications including digital televisions, LCD TVs, DVD recorders, video capture situations, and the like. A radio frequency (RF) or broadcast signal is provided to a tuner 104. The tuner 104 provides both video and audio outputs. The video output from the tuner 104 or a video signal from an external connection is provided to analog video decoder 102. The audio signal from the tuner 104 or an external audio signal is provided to an audio decoder 106. The output in the analog video decoder 102 is preferably an ITU-R BT 656 format digital signal, which may be either an eight or ten bit signal. This digital signal from analog video decoder 102 is provided to an MPEG (Motion Picture Experts Group) codec (coder-decoder) 108 to perform video compression in the digital domain. Similarly, the audio decoder 102 provides a PCM (Pulse Code Modulated) signal to the MPEG codec 108 to allow MPEG codec 108 to perform compression of the digital audio signal. The MPEG codec 108 in output mode provides an ITU-R BT 656 digital stream to an analog video encoder 110, which in turn produces an analog video signal output. Similarly, the MPEG codec 108 provides a PCM digital signal stream to an audio encoder 112, which provides an analog audio signal output.

The MPEG codec 108 is connected to a host bus 114 of a host CPU (Central Processing Unit) 116. The host CPU 116 performs processing operations and controls the various devices located in the PVR 100. The host CPU 116 is connected to flash memory 118 to hold its program and RAM (Random Access Memory) 120 for data storage. The host CPU 116 also interfaces with a front panel 122. A hard drive interface 124 is also connected to the host bus 114, with a hard drive 126 connected to the hard drive interface. The various decoders 102 and 106 and encoders 110 and 112 are also connected to the host bus 114 to allow control and setup by the host CPU 116.

In operation, audio and video signals are provided to the analog video decoder 102 and the audio decoder 106, which then provide their digital streams to the MPEG codec 108.

The host CPU 116 programs the MPEG codec 108 to transfer data to the hard drive interface 124, and thus to the hard drive 126, for storage. The host CPU 116 could at a later time direct data to be transferred from the hard drive 126 to the MPEG codec 108 for playback. Thus an analog video decoder 102 is an important part of such analog-to-digital video devices.

Figure 2:
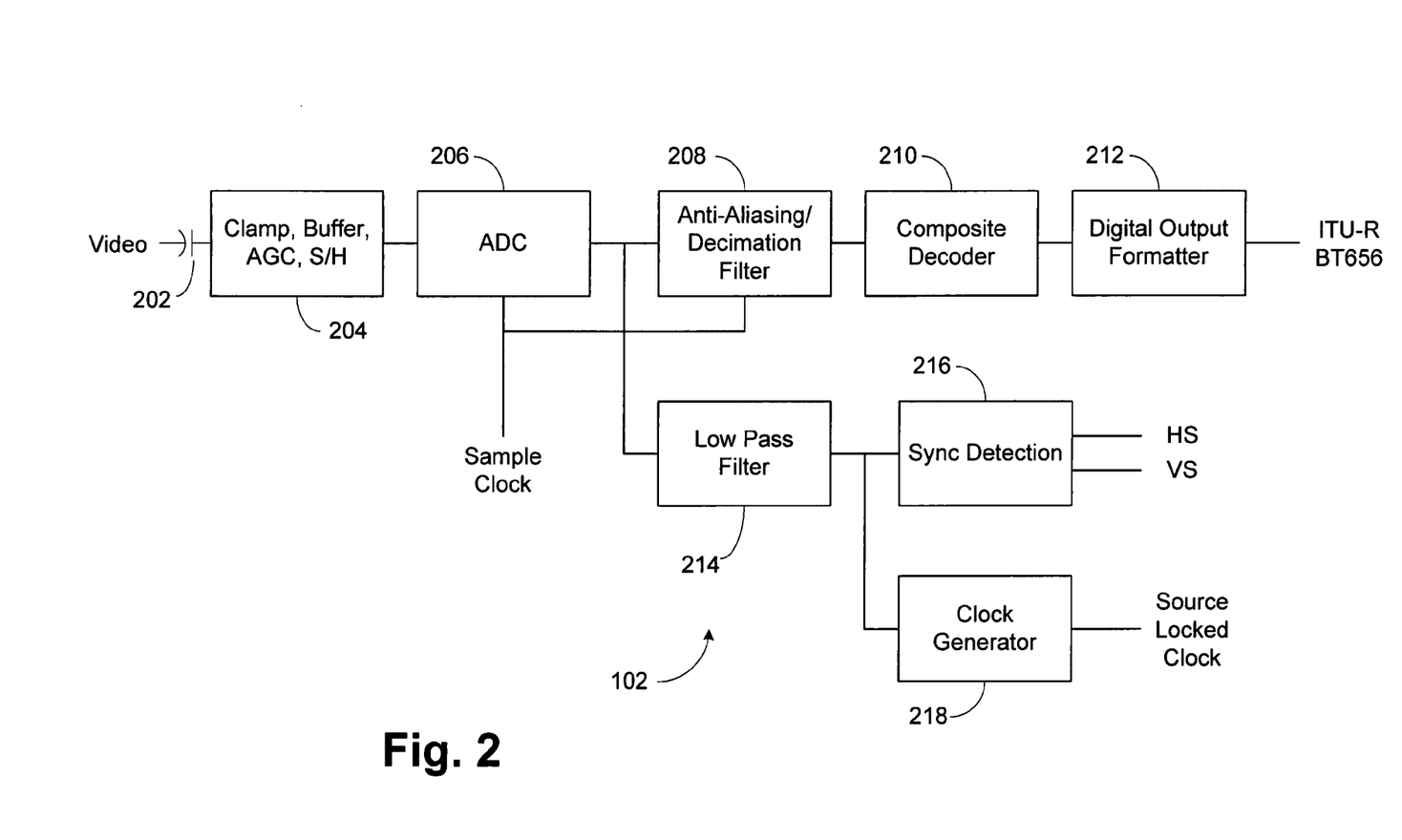
FIG. 2 is a block diagram of an analog video decoder according to the present invention.

A block diagram of an exemplary analog video decoder 202 is shown in FIG. 2. The video signal is provided to an external capacitor 202, and is then provided to a clamp, buffer, automatic gain control (AGC) and sample and hold (S/H) block 204. Block 204 provides clamping of the video signal to ensure that the video signal does not exceed limits, impedance buffering and line driving, and automatic gain control and sample and hold. The output is then utilized by an analog-to-digital converter (ADC) 206 which does the actual analog-to-digital conversion of the video rate signals. The ADC 206 is preferably operated on a sample clock, which is a free running sample clock and is not locked to the source video in the preferred embodiment. In alternate embodiments, a source locked clock signal could be used. The output of the ADC 206 is provided to an anti-aliasing/decimation filter 208 because preferably, the ADC 206 oversamples the video signal for increased accuracy. The anti-aliasing portion is a low pass filter used to remove sampling alias effects. The decimation filter then reduces the effective sample rate down to the desired rate, such as 27 MHz. The output of the anti-aliasing/decimation filter 208 is provided to a composite decoder 210 in the case of a composite video signal such as NTSC, PAL or SECAM. The composite decoder 210 separates the luma and chroma signals and provides these signals to a digital output formatter 212, which produces a 4:2:2, eight or ten bit signal according to the ITU-R BT 656 standard.

The output of the analog-to-digital converter 206 is also provided to a low pass filter 214 which removes any of the video content, leaving the sync signals. The output of the filter 214 is then provided to a sync detector 216, having outputs that are horizontal and vertical sync signals. The low pass filter 214 output is also connected to a clock generator 218, which is effectively a PLL and produces a source locked clock used by other devices, if appropriate.

One portion of video decoder 102 is composite decoder 210. One advantageous aspect of a composite decoder is the ability to demodulate SECAM signals. SECAM (Sequential Couleur Avec Mémoire) is a composite video standard generally used in France, some French-speaking countries, as well as Russia and some former Soviet republics. Details of SECAM and other composite video systems are generally known to those skilled in the art, and thus aspects not critical in the context of the present invention are not repeated here.

SECAM is similar to the PAL standard used in most countries other than the United States and Japan. In SECAM video, the line, field, and frame timing is identical to the PAL standard. However, unlike PAL, SECAM chroma (color) information is frequency modulated (FM) rather than phase modulated (PM). An FM modulated signal is simply a signal that will change in frequency by the rate of the modulating signal.

All color video signals comprise three color components: red, green, and blue. These colors are the three primary colors of light, and any color can be made by some combination of these three colors. SECAM brightness (luma) signal Y is simply a weighted sum of the red, green, and blue components. The luma signal alone can be displayed as a monochrome image, i.e., black and white television. SECAM color information comprises two color difference signals Dr and Db. The Dr signal is a scaled difference between the red signal and the luma signal. The Db signal is a scaled difference between the blue signal and the luma signal. Thus the original red, green, and blue components can be readily derived from the luma signal Y and the color difference signals Dr and Db.

The color difference signals Dr and Db are FM modulated on a 4.43 MHz center carrier ±approximately 200 kHz. Thus to provide for demodulation of SECAM signals, an FM demodulator is required. Furthermore, it is advantageous to provide the capability to perform FM demodulation without the addition of substantial additional circuitry and/or logic to a video decoder.

One technique for accomplishing this objective is to use the time-based FM demodulation apparatus and technique of the present invention. In the case of SECAM video signals, the bandwidth of the Dr and Db signals is limited to approximately 1.2 MHz. This relatively limited bandwidth means that adequate samples of the carrier are available to compute the zero crossing change of the carrier (and hence FM demodulate). This advantageously allows FM demodulation to be performed using the time base correction module that is already present in a video decoder. Although described in terms of demodulating SECAM video signals, the present invention is not so limited, and may advantageously be used to demodulate any FM signal.

Figure 3:
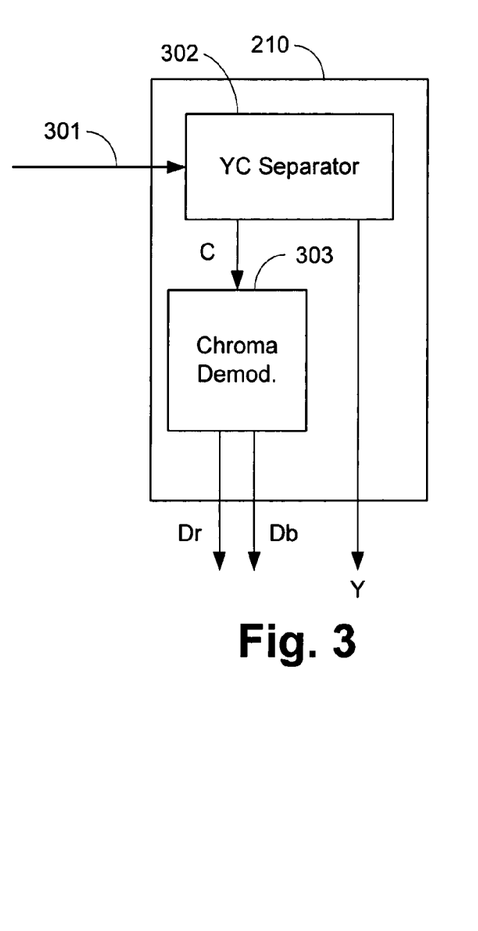
FIG. 3 is a block diagram depicting a composite decoder portion of an analog video decoder according to the present invention.

The SECAM composite video signal is composed of luma information "Y" (brightness) and chroma information "C" (color). With reference to FIG. 3, a sampled (digitized) version of the SECAM composite video signal 301 is input into composite decoder 210. Specifically, the signal is input into YC separator 302, which subtracts the luma information from the composite signal. This luma signal Y is one output of composite decoder 210. The color signal C, which remains after the luma signal is separated, is passed into chroma demodulator 303. Chroma demodulator 303 will separate the chroma signal C into its two components Dr and Db. Alternating lines of the SECAM signal will include either the Dr or Db signal. Thus a first line will be encoded, for example, with the Dr color information, and a next line will be encoded with the Db color information.

Figure 4:
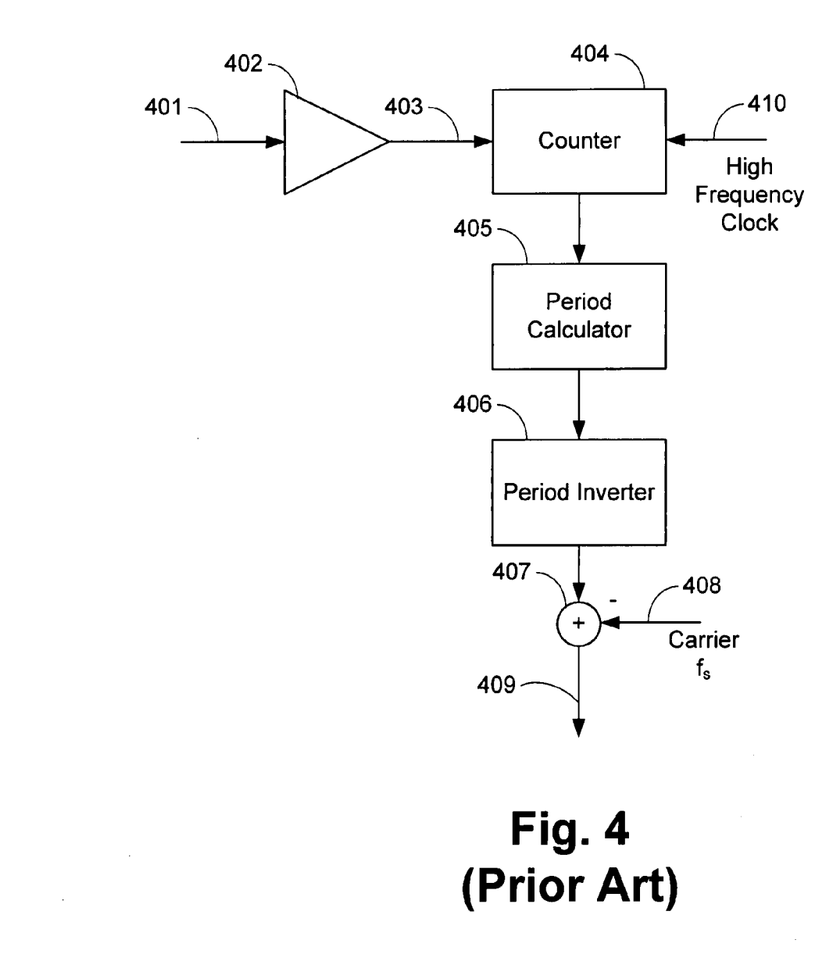
FIG. 4 illustrates a prior art analog time-based FM demodulator.

Chroma demodulator 303 is essentially an FM demodulator, with a commutation switch so that the demodulated color difference signal can be output to the correct Dr or Db line depending on which color difference signal is present for the current line. A typical prior art time-based FM demodulator used in many DSP applications is illustrated in FIG. 4. An FM modulated signal 401 is input into a high gain amplifier 402. The output of high gain amplifier 402 saturates from virtually any input, creating a square wave 403 at its output, with the square wave having a period, i.e., time between zero crossings, identical to the FM modulated signal 401.

This square wave 403 serves as the input to counter 404. Counter 404 also has as an input high frequency clock 410. Typically high frequency clock 410 is about 128 times faster than period of the square wave. The number of counts output from counter 404 are used to determine the period of the square wave by period calculator 405. This calculated period is inverted by period inverter 406 to determine a frequency. The determined frequency is input into summing module 407, which subtracts the carrier frequency $f_s$. The determined frequency minus the carrier frequency is the demodulated signal 409.

Figure 5:
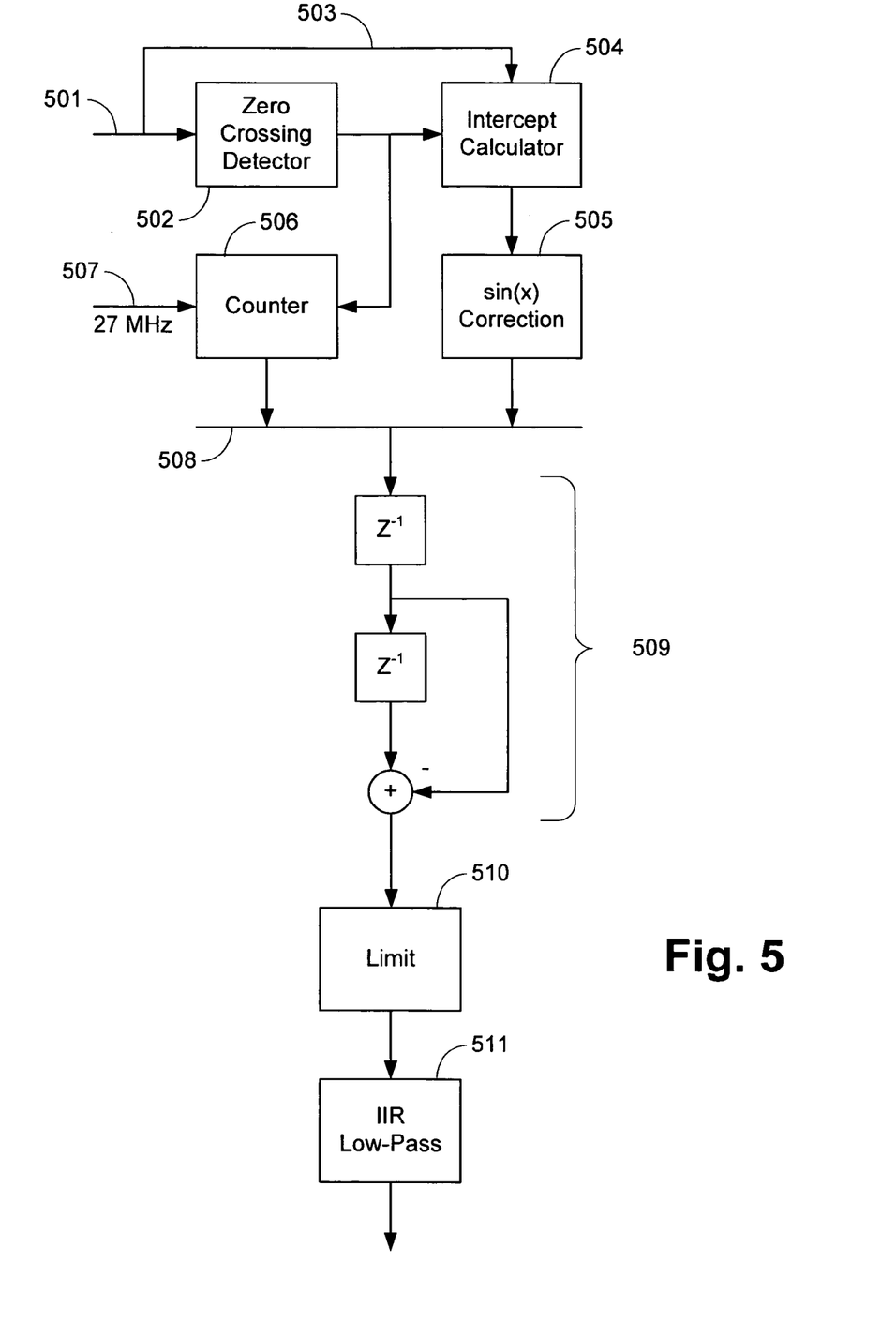
FIG. 5 illustrates a digital time-based FM demodulator according to the present invention.

A time-based FM demodulator according to the present invention is illustrated in FIG. 5. The digital samples of the FM signal 501 are input into a zero crossing detector 502.

Zero crossing detector 502 creates a signal that will change state when the digital sampled data passes through zero (i.e., changes sign). The zero crossing "trigger" signal is input to counter 506, which is driven by clock 507. For purposes of the video demodulation application described herein, the clock is driven at 27 MHz; however, the clock may be driven at any appropriate frequency for other applications. In any case, the clock signal and zero crossing pulses input into counter 506 allow the counter to determine the number of clock cycles between zero crossings, and thus coarsely determine the frequency. The frequency is only coarsely determined because the resolution is limited to the resolution of clock 507. However, the present invention further provides for additional resolution enhancement of the frequency determination.

The digital samples of FM signal 501 are also input along path 503 to intercept calculator 504. The zero crossing trigger signal generated by zero crossing detector 502 is also input into intercept calculator 504, causing it to store the sample value prior to the zero crossing and the sample value post zero crossing. This operation may be further understood with reference to FIG. 6. The analog FM modulated sine wave 601 is represented as a series of digital samples, indicated by waveform 602. The sampled values are input into the zero crossing detector 502. When zero crossing detector 502 detects the sign change between sample 603 (a positive value) and sample 604 (a negative value), the output signal of the zero crossing detector 502 causes the intercept calculator to retain the sample values 603 and 604 for further processing.

Figure 6:
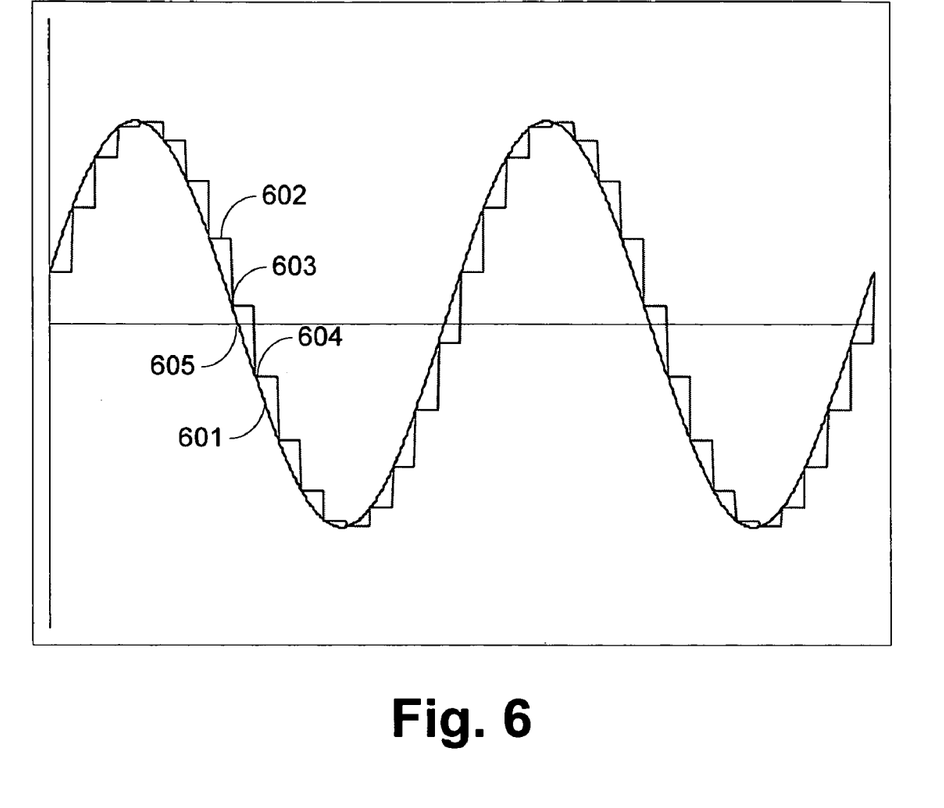
FIG. 6 illustrates a frequency modulated waveform and a digitally sampled version of the FM waveform to better understand certain teachings of the present invention.

Intercept calculator 504 performs an interpolation between the samples 603 and 604 to approximate the actual intercept 605 of the FM waveform. The calculated intercept indicates what fraction of a cycle of the demodulation clock 507 should be subtracted from the count determined by counter 506 to further refine the demodulated frequency. By calculating the intercept, and reducing the integer clock count by this fractional value, the effective resolution to signal period is significantly enhanced. Furthermore, this enhanced resolution is achieved without the need to increase the sample frequency as typically done in prior art time-based FM demodulators.

In a preferred embodiment, the calculated intercept determined by interpolation by intercept calculator 504 may be further refined by sin(x) corrector 505. As noted above, intercept calculator 504 determines the location of intercept 605 by linear interpolation between samples 603 and 604. However, the actual analog signal is a sine wave, not a linear function. The deviation between the linear function used in the interpolation and the actual value of the intercept of the sine wave may impose additional error on the order of several percent, which introduces noise into the signal. Therefore sin(x) corrector 505 takes advantage of the edge rates and pre-emphasis of SECAM signaling to reduce the error of intercept calculation and reduce the noise in the signal. In a preferred embodiment, this correction is performed by a lookup table arrangement, although other techniques will be apparent to those skilled in the art.

The total period (and thus frequency) of the FM waveform is then determined at 508 by taking the number of clock pulses counted by counter 506 and subtracting the fraction of a clock pulse indicated by the intercept calculation and optional sin(x) refinement. Because video data is continuous, it is necessary to determine the moving period of the FM signal, which is performed by operational block 509. At this point, the FM demodulation is substantially complete. However, additional post processing based on known characteristics of the SECAM video signal may be applied to further reduce noise. For example, limiter 510 may be applied to limit the data ranges and reject spurious frequencies by checking the computed period based on expected signal profiles of SECAM signaling. The limiter will reject unexpected values (based on SECAM signal profiles) further reducing noise and decode errors. Additionally, infinite impulse response (IIR) low pass filter 511 may be used to de-emphasize certain parts of the signal that are emphasized as part of standard SECAM signaling. This filter 511 may also be used to integrate the FM signal, which further reduces noise in the system.

Thus by providing a mechanism for digital time-based demodulation of the chroma component of a SECAM composite video signal, the error/noise performance of a video decoder may be substantially enhanced while reducing the cost and complexity of the video decoder. While illustrative embodiments of the invention have been illustrated and described, it will be appreciated that various changes can be made therein without departing from the spirit and scope of the invention.

The invention claimed is:

1. A method of demodulating a frequency modulated signal comprising:
    sampling the frequency modulated signal to produce a digital representation of the frequency modulated signal;
    detecting a plurality of zero crossings of the digital representation;
    determining a number of fixed time periods between the plurality of zero crossings;
    calculating an intercept for each of the plurality of zero crossings, wherein the intercept is calculated by interpolation between a sample prior to the zero crossing and a sample subsequent to the zero crossing; and
    determining a frequency of the frequency modulated signal from the number of fixed time periods and the calculated intercept.

2. The method of claim 1 wherein determining the period of the signal from the number of fixed time periods comprises reducing a sum of the number of fixed time periods by a fraction of the fixed time period determined by the interpolation.

3. The method of claim 2 further comprising:
    correcting the calculated intercept to account for non-linearity of the frequency modulated signal.

4. The method of claim 1 further comprising:
    correcting the calculated intercept to account for non-linearity of the frequency modulated signal.

5. The method of claim 1 wherein the frequency modulated signal comprises chroma information from a SECAM composite video signal obtained by passing the SECAM composite video signal through a luma-chroma separator.

6. The method of claim 5 further comprising filtering the determined frequency to eliminate spurious frequencies inconsistent with a SECAM chroma signal.

7. The method of claim 5 further comprising passing the determined frequency through a de-emphasis filter to eliminate effects of pre-emphasis on the signal.

8. A digital time-based FM demodulation circuit comprising:
    a zero crossing detector configured to receive samples of a frequency modulated signal and output a zero crossing indicating signal;
    a counter configured to receive a clock signal and the zero crossing indicating signal and to output a number of clock pulses between zero crossings; and an intercept calculator configured to receive the samples of the frequency modulated signal and the zero crossing indicating signal and calculate an intercept of the frequency modulated signal by interpolation between a sample prior to a detected zero crossing and a sample subsequent to the detected zero crossing;

whereby a frequency of the frequency modulated signal may be determined from a time corresponding to the number of clock pulses between zero crossings determined by the counter minus a time corresponding to a fraction of a clock pulse determined by the intercept calculator.

9. The digital time-based FM demodulation circuit of claim 8 further comprising:

a filter configured to receive the output of the intercept calculator and correct an error introduced by the interpolation.

10. The digital time-based FM demodulation circuit of claim 8 wherein the frequency modulated signal comprises chroma information from a SECAM composite video signal obtained by passing the SECAM composite video signal through a luma-chroma separator.

11. The digital time-based FM demodulation circuit of claim 10 further comprising a filter configured to receive the frequency and eliminate spurious frequencies inconsistent with a SECAM chroma signal.

12. The digital time-based FM demodulation circuit of claim 10 further comprising a de-emphasis filter to eliminate effects of pre-emphasis on the frequency modulated chroma signal according to a SECAM video standard.

13. A composite decoder for use in an analog video decoder, the composite decoder comprising:

a luma-chroma separator configured to receive a composite video signal and to output a luma component of the composite video signal separately from a chroma component of the composite video signal;

a chroma demodulator configured to receive the chroma component and to demodulate the frequency modulated color difference components of the composite video signal, wherein the chroma demodulator comprises:

a zero crossing detector configured to receive samples of a frequency modulated signal and output a zero crossing indicating signal;

a counter configured to receive a clock signal and the zero crossing indicating signal and to output a number of clock pulses between zero crossings; and an intercept calculator configured to receive the samples of the frequency modulated signal and the zero crossing indicating signal and calculate an intercept of the frequency modulated signal by interpolation between a sample prior to a detected zero crossing and a sample subsequent to the detected zero crossing;

whereby a frequency of the frequency modulated signal may be determined from a time corresponding number of clock pulses determined by the counter minus a time corresponding to a fraction of a clock pulse determined by the intercept calculator.

14. The composite decoder of claim 13 wherein the chroma demodulator further comprises a filter configured to receive the output of the intercept calculator and correct an error introduced by the interpolation performed on the frequency modulated signal.

15. The composite decoder of claim 13 wherein the frequency modulated signal comprises chroma information from a SECAM composite video signal obtained by passing the SECAM composite video signal through the luma-chroma separator.

16. The composite decoder of claim 15 further comprising a filter configured to receive the frequency and eliminate spurious frequencies inconsistent with a SECAM chroma signal.

17. The composite decoder of claim 15 further comprising a de-emphasis filter to eliminate effects of pre-emphasis on the frequency modulated chroma signal according to a SECAM video standard.

18. A video decoder comprising:

an input module comprising circuits for performing one or more operations selected from the group consisting of: clamping, buffering, automatic gain control, and sampling and holding;

an analog-to-digital converter having an input coupled to the output of the input module and providing an analog-to-digital converter output;

a composite decoder having a composite decoder input coupled to the analog-to-digital converter output and providing a composite decoder output;

a digital formatter having a digital formatter input coupled to said composite decoder output and providing a digital video signal output;

a sync detector circuit having a sync detector input configured to receive the digital video signal output and provide horizontal and vertical sync outputs; and a clock generator having a clock generator input configured to receive the digital video signal output and provide a source locked clock output;

wherein the composite decoder comprises a luma-chroma separator configured to receive a composite video signal and to output a luma component of the composite video signal separately from a chroma component of the composite video signal and a chroma demodulator configured to receive the chroma component and to demodulate frequency modulated color difference components of the composite video signal, wherein the chroma demodulator comprises:

a zero crossing detector configured to receive samples of a frequency modulated signal and output a zero crossing indicating signal;

a counter configured to receive a clock signal and the zero crossing indicating signal and to output a number of clock pulses between zero crossings; and an intercept calculator configured to receive the samples of the frequency modulated signal and the zero crossing indicating signal and calculate an intercept of the frequency modulated signal by interpolation between a sample prior to a detected zero crossing and a sample subsequent to the detected zero crossing;

whereby a frequency of the frequency modulated signal may be determined from a time corresponding to the number of clock pulses determined by the counter minus a time corresponding to a fraction of a clock pulse determined by the intercept calculator.

19. The video decoder of claim 18 wherein the chroma demodulator further comprises:

a filter configured to receive the output of the intercept calculator and correct an error introduced by the interpolation performed on the frequency modulated signal.

20. The video decoder of claim 18 wherein the frequency modulated signal comprises chroma information from the composite video signal obtained by passing the composite video signal through the luma-chroma separator.

21. The video decoder of claim 20 further comprising a filter configured to receive the frequency and eliminate spurious frequencies inconsistent with a SECAM chroma signal.

22. The video decoder of claim 20 further comprising a de-emphasis filter to eliminate effects of pre-emphasis on the frequency modulated chroma signal according to a SECAM video standard.

* * * * *